United States Patent [19]
Yu et al.

[11] Patent Number: 5,770,509
[45] Date of Patent: Jun. 23, 1998

[54] METHOD FOR FORMING AN INDUCTOR DEVICES USING SUBSTRATE BIASING TECHNIQUE

[75] Inventors: Hyun-Kyu Yu; Min Park, both of Daejeon, Rep. of Korea

[73] Assignee: Electronics & Telecommunications Research Institute, Daejeon, Rep. of Korea

[21] Appl. No.: 844,750

[22] Filed: Apr. 22, 1997

[30]      Foreign Application Priority Data

Dec. 6, 1996 [KP] DPR of Korea ................. 9662617

[51] Int. Cl.$^6$ .................................................. H01L 21/20
[52] U.S. Cl. ..................... 438/381; 438/171; 438/238; 438/329
[58] Field of Search ................................. 438/381, 171, 438/170, 238, 329, 901

[56]         References Cited

U.S. PATENT DOCUMENTS

| | | | |
|---|---|---|---|
| 5,450,263 | 9/1995 | Desaigoudar et al. | 438/381 |
| 5,539,241 | 7/1996 | Abidi et al. | 438/238 |
| 5,550,068 | 8/1996 | Hirano et al. | 438/381 |

*Primary Examiner*—Trung Dang
*Attorney, Agent, or Firm*—Cohen, Pontani, Lieberman, Pavane

[57]          ABSTRACT

Methods for foming an inductor devices used for impedance matching in the radio frequency integrated circuits are disclosed. In the integrated inductor device according to the present invention, an additional electrode is arranged in surroundings of an inductor metal line, and the reverse bias voltage is applied to the region between the substrate and the electrode so as to form a depletion layer. Therefore, the substrate biasing is effected and thus an inductor having improved performance can be formed by decreasing the parasitic capacitance between the inductor metal line and the substrate. The present invention can also be applied to another semiconductor device having metal lines and pads.

8 Claims, 6 Drawing Sheets

METHOD FOR FORMING AN INDUCTOR DEVICES USING SUBSTRATE BIASING TECHNIQUE

BACKGROUND OF THE INVENTION

1. Field of the Invention

The present invention relates to a fabrication method of an integrated inductor devices having reduced parasitic capacitance between metal lines for inductor and a substrate, and having improved functions using the substrate biasing technique.

2. Description of the Related Art

Generally, the radio frequency integrated circuits is designed to include an inductor for the impedance matching. The inductance and quality factor of the inductor are decisive factors for determining the performance of the matching circuit. Recently, it is possible to realize an integrated inductor (or, monolithic inductor) which is formed by integrating an inductor on a substrate, and accordingly, researches into the integration of an active device and a matching circuit is actively underway. The performance of the integrated inductor, especially the quality factor is dependent on a substrate onto which the inductor is integrated, since the parasitic capacitance between the metal line of the inductor and the substrate plays an important role. Specially, as the parasitic capacitance becomes larger, the quality factor will be lowered, which leads the result of the deterioration of the RF IC performance.

FIG. 1A shows a cross-sectional view of an inductor device according to the prior art. As shown in FIG. 1A, the inductor according to the prior art comprises an inter-layer dielectric film 2 deposited on a silicon substrate 1 having a predetermined underlayer on which predetermined devices such as CMOS is formed. A first metal line 3 is connected to a second metal line 6 which constitutes an inductor via a contact 5 formed in an inter-layer dielectric film 4. The reference numeral 7 indicates a passivation film for protecting the inductor device. FIG. 1B shows a plan view of the inductor device shown in FIG. 1A. As can be seen, the inductor includes the second metal line 6 which has a square shape and is connected to the first metal line 3 via the contact 5. In such a constitution, the parasitic capacitance is determined by the distance between the substrate 1 and the second metal line 6. Therefore, the parasitic capacitance can be controlled only by the thickness of the inter-layer dielectric films between them. As a result, it is very difficult to decrease the parasitic capacitance.

SUMMARY OF THE INVENTION

In view of the foregoing, it is an object of the present invention to provide method of forming an inductor device having improved performance by decreasing the parasitic capacitance between the metal line and the substrate by using the substrate biasing technique, in order to minimize the interference between the substrate and signal lines.

In order to accomplish the above object, the present invention provides a method of forming an inductor device on a semiconductor substrate, comprising the steps of forming a predetermined trench in the semiconductor substrate; depositing doped polysilicon layer doped with dopants of the conductivity type which is the opposite conductivity type to that of the substrate on the resultant structure; forming an electrode within the trench by removing said polysilicon layer so as to leave said polysilicon layer within said trench and expose said semiconductor substrate; forming a first inter-layer dielectric film on the resultant structure; forming a predetermined contact in said electrode and said semiconductor substrate, respectively; forming a first metal line and a second metal line for applying a predetermined voltage to said electrode and said semiconductor substrate; forming a second inter-layer dielectric film on the resultant structure; and forming an inductor metal line which is not overlapped with said electrode as seen from the above thereof.

BRIEF DESCRIPTION OF THE DRAWINGS

The above and other objects and features of the present invention will become apparent from the following description of preferred embodiments, when taken in conjunction with the accompanying drawings, in which.

DETAILED DESCRIPTION OF THE PREFERRED EMBODIMENTS

Figure 1A:
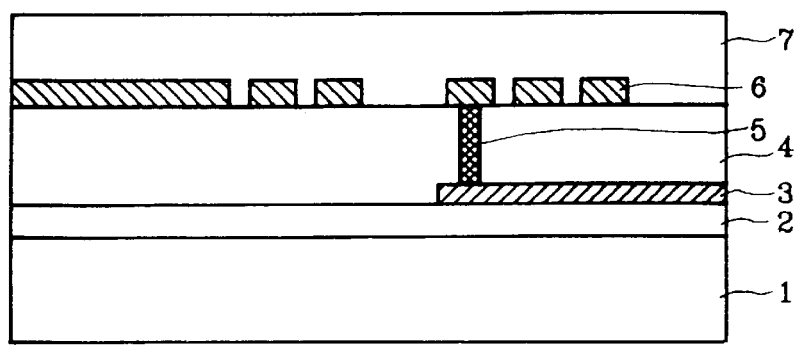
FIG. 1A shows a cross-sectional view of an inductor device according to the prior art.
Figure 1B:
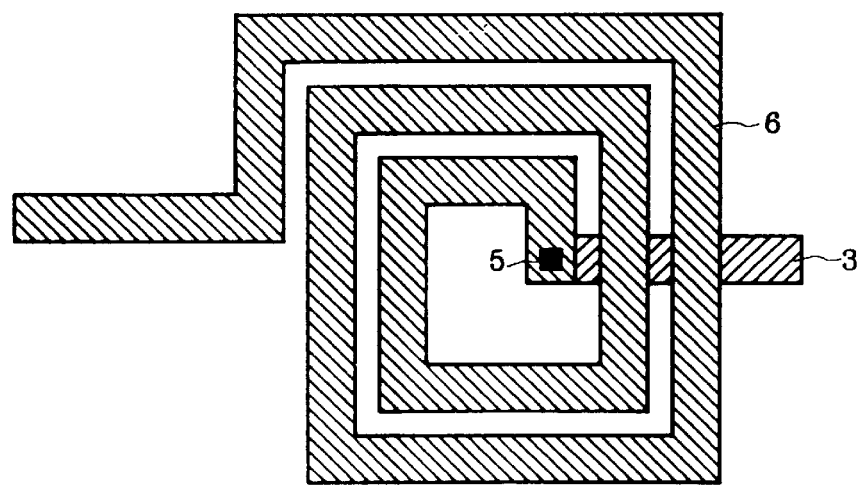
FIG. 1B shows a plan view of the inductor device according to the prior art.
Figure 2:
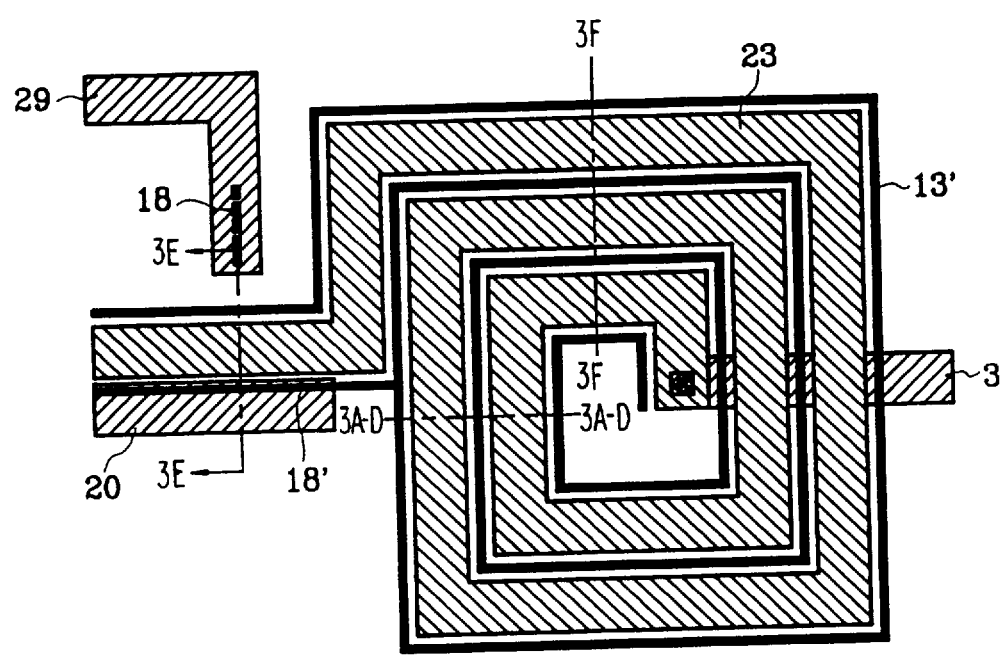
FIG. 2 shows a plan view of the inductor device according to the present invention.

FIG. 2 shows a plan view of the inductor device having a square shape according to the present invention, in which the construction of an inductor comprising a first metal line, a second metal line and a connecting contact is the same as the case of the prior art, excepting an electrode 13' constituted by a trench formed between the metal lines along the inductor metal lines. The voltage can be applied to the trench electrode 13' through a contact 18' and a metal line 20. Similarly, a metal line 29 can be electrically connected to a substrate through contacts 18. In this case, the voltage is applied to the substrate via the metal line 29.

Next, the forming method of the inductor according to an embodiment of the present invention is described.

FIGS. 3A to 3D shows cross-sectional views along the line A-A' in FIG. 2 illustrating the process for forming the inductor device by using the substrate biasing technique according to the present invention.

Figure 3A:
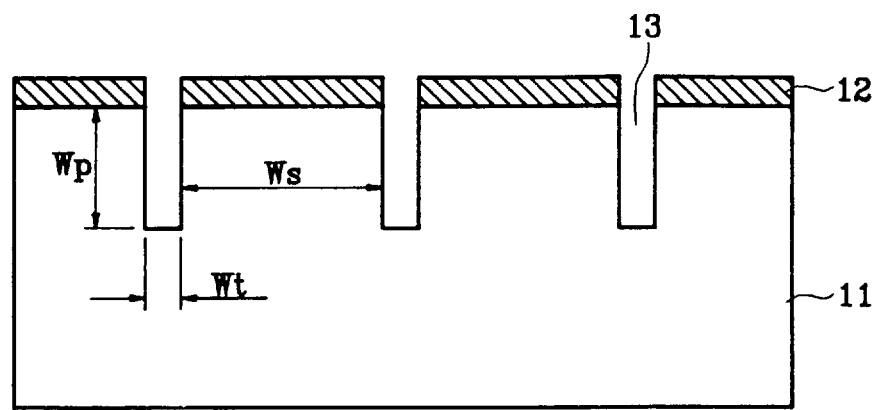
FIGS. 3A to 3F show cross-sectional views illustrating the process for forming the inductor device according to an embodiment of the present invention.

Referring to FIG. 3A, a predetermined mask pattern 12 is formed on a semiconductor substrate 11, for example by a photolithography process. Then, a trench 13 is formed at intervals of a predetermined distance in the substrate 11 using the mask pattern 12 as an etching mask. The width Wt, the depth Wp and the distance Ws of the trench 13 can be suitably selected respectively according to the metal lines of the inductor device to be formed at succeeding processes.

Figure 3B:
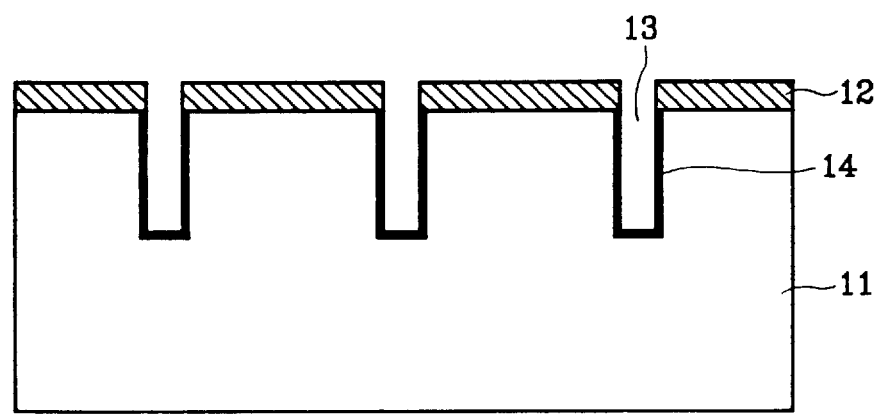

Referring to FIG. 3B, a doped layer 14 is formed in the inner walls of the trench 13 by implanting dopants of the conductivity type, which is the opposite conductivity type to that of the substrate 11, into the substrate 11. For example, the doped layer 14 is formed by implanting N-type dopants into the P-type substrate.

Figure 3C:
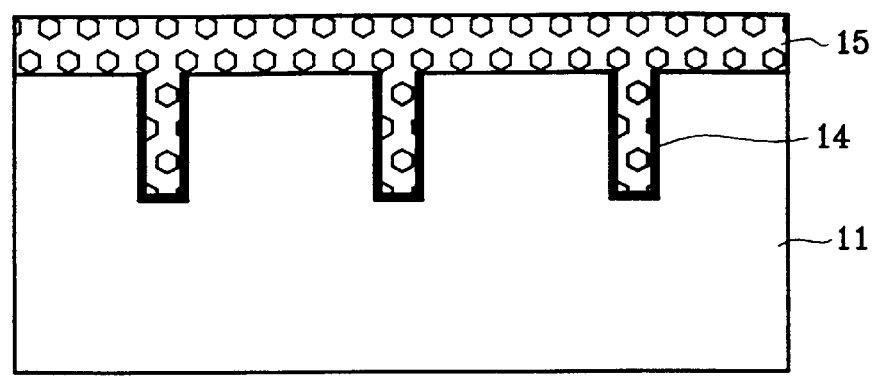

Referring to FIG. 3C, the mask pattern 12 is removed from the resultant structure and a polysilicon layer 15 is deposited such that the trench 13 is completely filled with the polysilicon layer 15. As a result, dopants in the doped layer 14 can be diffused into the polysilicon layer 15 at succeeding thermal processes. Alternatively, an doped polysilicon layer can be formed in situ. In this case, the step of implanting dopants for forming the N-type (or, P-type) doped layer in the inner walls of the trench 13 can be omitted. As a result, the polysilicon layer 15 is connected to the doped layer 14.

Figure 3D:
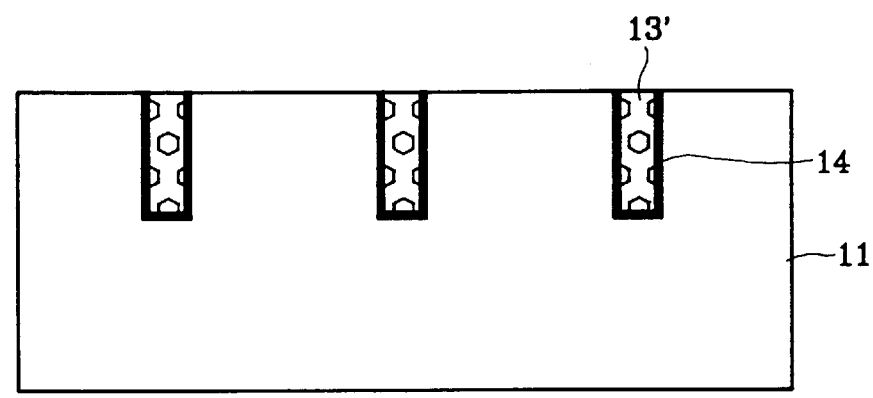

Referring to FIG. 3D, the polysilicon layer 15 is removed from the resultant structure by a dry etching method using a blanket etching process without mask, or chemical mechanical polishing (CMP) method, so as to expose the surface of the silicon substrate and simultaneously form a tench electrode 13' composed of polysilicon in the trench 13. The exposed surface of silicon substrate is the region in which an inductor is not formed. The exposed surface of silicon substrate is used for forming an active element such as MOSFET or bipolar device which constitutes RF IC.

Figure 3E:
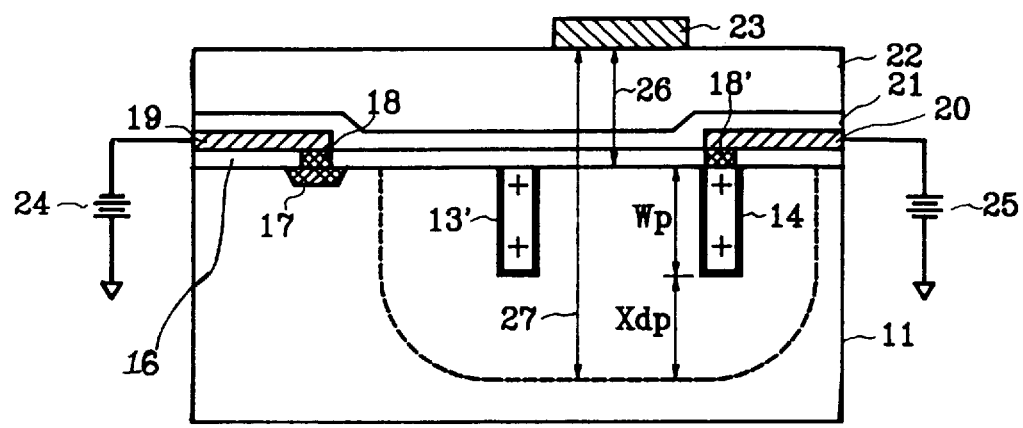

FIG. 3E is a cross-sectional view along the line B-B' in FIG. 2. Referring to FIG. 3E, an insulating layer 16 of oxide film or silicon nitride film is formed on the resultant structure. And, a doped layer 17, contacts 18 and 18' and metal lines 19 and 20 are formed by a conventional process. Here, the negative voltage from a power supply 24 (or, grounding) is applied to the substrate 11 via the metal line 19, the contact 18 and the doped layer 17, while the positive voltage from a power supply 25 is applied to the trench electrode 13' via the metal line 20 and the contact 18'. The positive voltage applied to the trench electrode 13' passes through the N-type doped layer 14. As a result, reverse bias voltage is applied to the space between the P-type substrate 11 and the N-type doped layer 14, between which the trench electrode 13' is sandwiched, and thus a depletion layer Xdp is formed in the silicon substrate 11. Then, an insulating layer 21 of oxide film or silicon nitride film is formed on the resultant structure, an inter-layer insulating layer 22 is formed by depositing BPSG, and a metal line 23 for inductor is formed by a conventional process. The metal line 23 for inductor should not be overlapped with the trench electrode 13'. As described above, the parasitic capacitance is determined by the distance 26 extending from the substrate 1 to the inductor metal line 6 according to the prior art. While, according to the present invention, the parasitic capacitance is determined by the distance 27 which corresponds to the sum of the depth 26 of the insulating layers, the depth Wp of the trench electrode 13' and the depth Xdp of the depletion layer since the substrate 11 is changed into the depletion layer by applying the reverse bias voltage to the substrate 11. Thus, the parasitic capacitance is remarkably decreased. In other words, the parasitic capacitance is decreased as the depth Xdp of the depletion layer is increased since the capacitance is in reverse proportion to the depth of the depletion layer. An N$^+$-type depletion layer which may be formed in the inner walls of the trench is negligible. In the present invention, the depth Xdp of the depletion layer is defined as follows:

$$Xdp = \left[ \frac{2\epsilon(\phi_O - V_R)N_D}{qN_A(N_A + N_D)} \right]^{1/2}$$

$$\phi_O = V_T \ln \frac{N_A N_D}{n_i^2}$$

wherein, $\epsilon$ denotes the silicon dielectric constant, $V_T$ denotes Boltzmann's thermal voltage having the value of 26 mV at the room temperature, and $N_A$, $N_D$ and $n_i$ are the concentration of the P-type dopants, the concentration of the N-type dopants, and the concentration of the intrinsic dopant of silicon, respectively. In the present invention, when the concentration in the N$^+$-type layer $N_D$=1×10$^{20}$/cm$^3$, the concentration in the silicon substrate $N_A$=7×10$^{12}$/cm$^3$, $n_i$=1.5×10$^{10}$/cm$^3$ and $V_R$=−3V. In other words, the reverse bias voltage between the positive voltage power supply 25 and the negative voltage power supply 24 is −3V, Xdp is equal to about 26.5 μm and when $V_R$=−5V, Xdp is equal to about 34.7 μm. Therefore, if the trench electrode 17 arranged such that a distance Ws between the trench electrodes 13' is equal to the sum of the depletion layer formed by the trench electrode, which corresponds to the value of 2×Xdp, or less, and the whole region in which the trench electrodes are arranged can be depleted. The inductor metal line is positioned between the trench electrodes, so that no additive parasitic capacitance due to the overlap of the inductor metal line 23 and the trench electrode 13' is generated. The rule of layout for the effective arrangement of the inductor metal line, trench electrode and the like for decreasing the parasitic capacitance by using the substrate biasing technique is as follows:

2Xdp≧distance between trench electrodes≧width of inductor metal line

Preferably, the silicon substrate having a large resistance is used for forming the depletion layer having a large thickness Xdp.

Figure 3F:
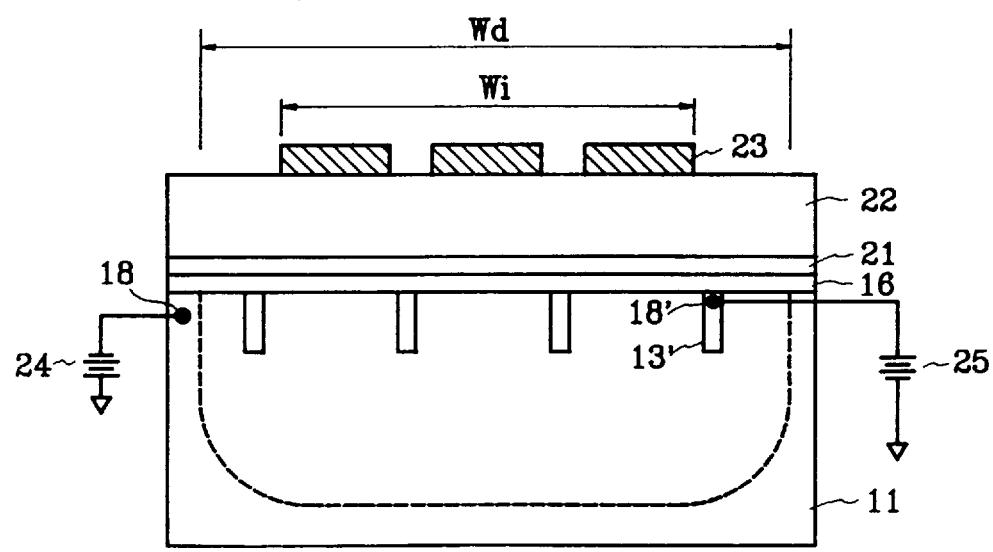

FIG. 3F shows a cross-sectional view along the line C-C' in FIG. 2. As can be seen from the drawing, the positive voltage 25 is transmitted to the contact 18 (FIG. 3E) of the trench electrode 13' (FIG. 3E) through the metal line 20 (FIG. 3E). The width Wi of the region in which the inductor metal lines 23 are arranged is included in the overall width Wd of the depletion layer, and the inductor metal lines 23 are not overlapped with the trench electrode 13' (FIG. 3E).

Figure 4:
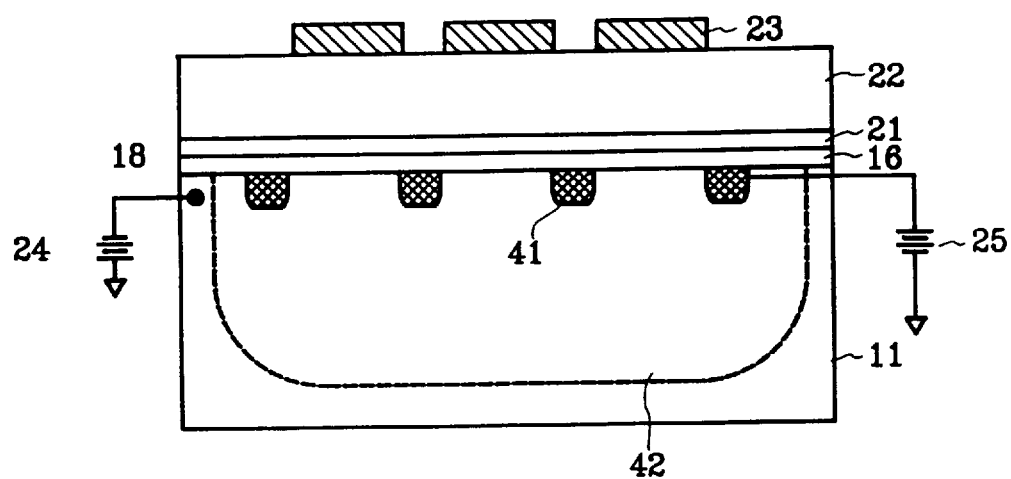
FIG. 4 shows a cross-sectional view illustrating the process for forming the inductor device according to another embodiment of the present invention.

Referring to FIG. 4, showing a cross-sectional view of an inductor device according to another embodiment of the present invention, an N$^+$-type diffusion layer 41 is used for depleting a P-type substrate 11, instead of a trench electrode. Each diffusion layer 41 is electrically connected with one another so that the positive voltage 25 is transmitted to N$^+$-type diffusion layer 41 and negative voltage 24 is transmitted to the substrate 11 through a contact 18 to form a depletion layer 42 by the reverse bias voltage between the N$^+$ diffusion layer and the substrate. In such an arrangement, the depth of the diffusion layer 41 is shallow in comparison with that of the trench electrode. Thus, it can be applied when the concentration in the substrate 11 is sufficiently low (i.e., when the resistance in the substrate is sufficiently large).

Figure 5:
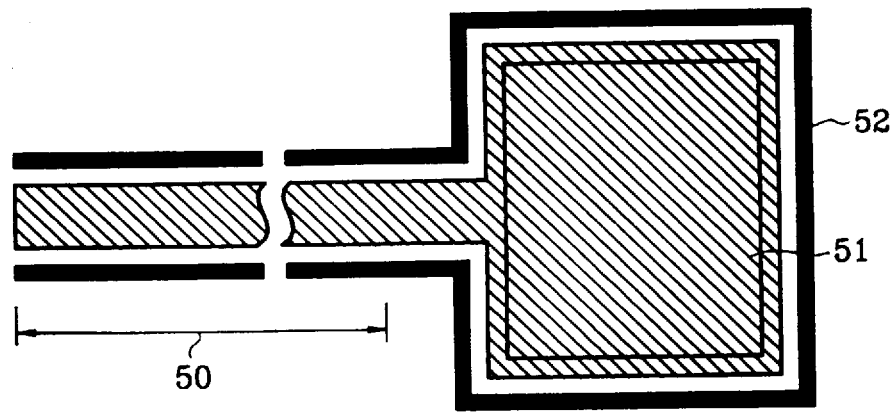
FIG. 5 shows a plan view of the semiconductor device according to further embodiment of the invention.

FIG. 5 shows an example of the semiconductor device in which the electric signals are transmitted between a general metal line 50 and a bonding pad 51. Since a trench electrode 52 is formed in a substrate, the interference with the substrate can be decreased. If the length of the general metal line 50 becomes excessively long, the interference between the metal lines and the substrate can not be neglected and the parasitic components with the substrate in the bonding pad 51 is relatively increased in a high frequency wave. Thus, the unnecessary interference between the metal lines and the substrate can be remarkably decreased by using the substrate biasing technique according to the present invention.

As described above, the parasitic capacitance between the metal lines and the substrate is remarkably decreased by using the present invention. Therefore, the interference phenomenon between them is decreased and performance of the semiconductor device can be improved.

As described above, although the present invention has been described in detail with reference to illustrative embodiments, the invention is not limited thereto and various modifications and changes may be effected by one skilled in the art within the scope of the invention.

What is claimed is:

1. A method of forming an inductor device on a semiconductor substrate, comprising the steps of:

forming a predetermined trench in the semiconductor substrate;

depositing a doped polysilicon layer doped with dopants of the conductivity type which is the opposite conductivity type to that of the substrate on the resultant structure;

forming an electrode within the trench by removing said polysilicon layer so as to leave said polysilicon layer within said trench and expose said semiconductor substrate;

forming a first inter-layer dielectric film on the resultant structure;

forming a predetermined contact in said electrode and said semiconductor substrate, respectively;

forming a first metal line and a second metal line for applying a predetermined voltage to said electrode and said semiconductor substrate;

forming a second inter-layer dielectric film on the resultant structure; and forming an inductor metal line which is not overlapped with said electrode as seen from the above thereof.

2. The method of claim 1, wherein
   said polysilicon layer is removed by using a dry etching method using a blanket etching process without mask, or chemical mechanical polishing method.

3. The method of claim 1, wherein
   said electrode is N-type and said semiconductor substrate is P-type.

4. The method of claim 3, which comprises said semiconductor substrate being grounded and said electrode being applied with positive voltage.

5. A method of forming an inductor device on a semiconductor substrate, comprising the steps of:

forming a predetermined mask pattern on the semiconductor substrate;

forming a predetermined trench in the semiconductor substrate by using said mask pattern as an etching mask;

implanting dopants of the conductivity type which is the opposite conductivity type to that of said semiconductor substrate into the inner walls of said trench;

removing said mask pattern from the resultant structure;

depositing polysilicon layer on the resultant structure;

forming an electrode within the trench by removing said polysilicon layer so as to leave said polysilicon layer within said trench and expose said semiconductor substrate;

forming a first inter-layer dielectric film on the resultant structure;

forming a predetermined contact in said electrode and said semiconductor substrate, respectively;

forming a first metal line and a second metal line for applying a predetermined voltage to said electrode and said semiconductor substrate;

forming a second inter-layer dielectric film on the resultant structure; and forming an inductor metal line which is not overlapped with said electrode as seen from the above thereof.

6. The method of claim 5, wherein
   said polysilicon layer is removed by using a dry etching method using a blanket etching process without mask, or chemical mechanical polishing method.

7. The method of claim 5, wherein
   said electrode is N-type and said semiconductor substrate is P-type.

8. The method of claim 7, which comprises said semiconductor substrate being grounded and said electrode being applied with positive voltage.

* * * * *

UNITED STATES PATENT AND TRADEMARK OFFICE
CERTIFICATE OF CORRECTION

PATENT NO. : 5,770,509
DATED : June 23, 1998
INVENTOR(S) : Hyun-Kyub Yu, et al.

It is certified that error appears in the above-identified patent and that said Letters Patent is hereby corrected as shown below:

On the title page, delete inventors' names and location in their entirety and insert therefor:

Hyun-Kyu Yu; Min Park; Cheon-Soo Kim; Kee-Soo Nam, all of Daejeon, Rep. of Korea On the title page, under Foreign Application Priority Date, delete "[KP] DPR of Korea" and insert therefor:

--[KP] Rep. of Korea--

Signed and Sealed this

Second Day of February, 1999

Attest:

Attesting Officer

*Acting Commissioner of Patents and Trademarks*

UNITED STATES PATENT AND TRADEMARK OFFICE
CERTIFICATE OF CORRECTION

PATENT NO. : 5,770,509

DATED : June 23, 1998

INVENTOR(S) : Hyun-Kyub Yu, et al.

It is certified that error appears in the above-identified patent and that said Letters Patent is hereby corrected as shown below:

On the title page, delete the filing date "Apr. 22, 1997" and insert therefor:

-- Apr. 21, 1997--

Signed and Sealed this

Twenty-fifth Day of April, 2000

Attest:

Q. TODD DICKINSON

*Attesting Officer*    *Director of Patents and Trademarks*